United States Patent [19]

Tihanyi

[11] 3,859,716

[45] Jan. 14, 1975

[54] PRODUCTION OF THIN LAYER COMPLEMENTARY CHANNEL MOS CIRCUITS

[75] Inventor: Jeno Tihanyi, Neuried, Germany

[73] Assignee: Siemens Aktiengesellschaft, Berlin and Munich, Germany

[22] Filed: Sept. 24, 1973

[21] Appl. No.: 400,329

[30] Foreign Application Priority Data

Sept. 29, 1972 Germany .......... 2247975

[52] U.S. Cl. .......... 29/571, 29/578, 357/42, 357/91

[51] Int. Cl. .......... B01j 17/00

[58] Field of Search .......... 29/571, 576 B, 576 IW, 29/578; 317/235

[56] References Cited

UNITED STATES PATENTS

| | | | |
|---|---|---|---|
| 3,660,735 | 5/1972 | McDougall | 317/235 |
| 3,750,268 | 8/1973 | Wang | 29/571 |

*Primary Examiner*—Roy Lake
*Assistant Examiner*—W. Tupman
*Attorney, Agent, or Firm*—Hill, Gross, Simpson, Van Santen, Steadman, Chiara & Simpson

[57] ABSTRACT

A system for the production of thin layer complementary channel MOS circuits in which the semiconductor zones are applied in the form of island-like layers to an electrically insulating substrate. These semiconductor zones are provided with areas of varying doping. A gate insulator layer is in each circuit arranged on such island-like layers for transistors.

14 Claims, 3 Drawing Figures

PRODUCTION OF THIN LAYER COMPLEMENTARY CHANNEL MOS CIRCUITS

BACKGROUND OF THE INVENTION

Thin layer complementary channel MOS circuits, particularly those utilizing silicon (e.g., ESFI complementary channel MOS circuits), and methods for producing same are known. ESFI complementary channel MOS circuits (i.e., MOS circuits using epitaxial silicon films on insulators) are known to those skilled in the art as circuits in which silicon films or layers are epitaxially deposited on insulators where the insulator is an insulating substrate such as spinel, sapphire or the like. Between the individual silicon layers (in the form of island-like deposits in such circuits) air or a solid insulating intermediate layer or zone is positioned. These island-like silicon semiconductor layers contain source and drain zones produced by diffusion. Above the insulating zone between source and drain zones is arranged a gate insulator which usually comprises a layer of $SiO_2$. The source- and drain zones and the gate insulator layer are provided with electrodes, comprises, for example, of aluminum, or the like. ESFI complementary channel MOS circuits are more rapid than MOS circuits in solid silicon, since the pn-junction capacitances, as well as the capacitances between metallizations and the substrate, are practically dispensed with.

However, even in the conventional ESFI MOS circuits, parasitic capacitances still occur. As a result of such parasitic or overlapping capacitances between the gate electrode and the drain zone, and between the gate electrode and the source zone, the functioning speed of those conventional circuits is lower than in circuits in which these capacitances do not occur. There is therefore a need for ESFI MOS circuits which have reduced, or, preferably, substantially no such parasitic or overlapping capacitances.

BRIEF SUMMARY OF THE INVENTION

The present invention provides a process by which the above indicated parasitic capacitances in ESFI complementary channel MOS circuits can be minimized and substantially completely eliminated. In this process, a layer of electrode material is arranged on gate oxide layers and the exposed surfaces of semiconductor zones. In a first etching step, parts of the gate electrode layer above island-like semiconductor layers of one doping type are removed. Then, in the points thereof which are thus exposed, ions of a given concentration and of a first ion type are implanted by ion implantation into the areas of such so-etched island-like semiconductor layer. Next, in a second etching step, parts of the gate electrode layer above the points to be doped in the other or complementary island-like semiconductor layers are removed. Then, in the areas beneath the now exposed points of all the semiconductor zones, ions of a second ion type and in a concentration which results in a doping which is opposite to that produced with the first ions are implanted by ion implantation, provided that the concentration of the first ion type is greater than the concentration of the second ion type. The process may be employed as a self-adjusting implantation process.

Preferably, in the process of this invention, phosphorus ions are implanted for n-doping and boron ions are implanted for p-doping.

It is advantageously possible to use the gate electrode itself as a mask during ion implantation, and so self-adjusting is achieved.

A further advantage of the process of the present invention is that the doping of the n-regions with donors and the doping of the p-regions with acceptors can be carried out consecutively without the necessity of covering between such successive dopings the already doped regions with a protective layer.

DETAILED DESCRIPTION

Figure 1:
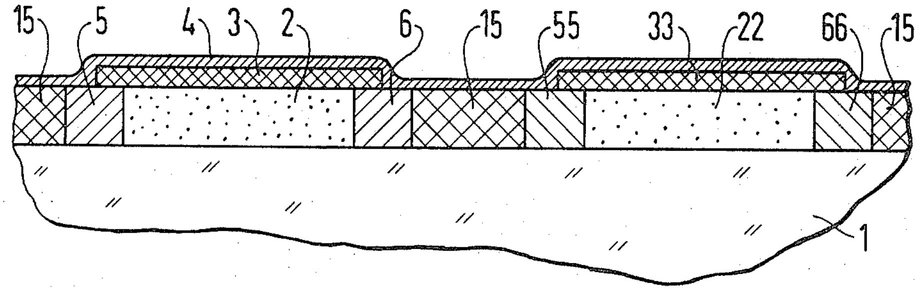
FIG. 1 is a diagrammatic vertical sectional view through one embodiment of an ESFI complementary channel MOS circuit, in an intermediate stage of construction in accordance with the teachings of the present invention.

After the production of ESFI complementary MOS circuit as shown in FIG. 1 by conventional diffusion oxidation- and photolithographic processes, in a first processing step following the teachings of the present invention, the gate electrode layer is partially removed either above the island-like semiconductor layers which are to be doped with acceptors, or above the island-like semiconductor layers which are to be doped with donors, so that in the areas which are then exposed, ions of a first ion type and at a given dose or concentration are implanted by ion implantation into the regions beneath the exposed areas.

In a further processing step, the metal layer is removed above the areas of the complementary island-like conductor regions so that complementary doping below such so exposed areas can take place through exposure thereof to ions of a second type applied at a given dose or concentration by ion implantation. In this second ion implantation, all the regions of a circuit which are exposed are doped with ions of such second ion type. The ions of such second ion type are of the opposite doping type relative to the ion of the first ion type. The dose or concentration of the ions of the second ion type is lower than the dose or concentration of the ions of the first type, in all cases.

When the two such ion implantation steps have been concluded, the zones or regions which were the first so implanted, contain the ions of both the first and the second type. As, however, the dose of the ions of the first doping type is greater than the dose of the ions of the second doping type, the doping type is determined by the first ion type.

In one embodiment, the present invention utilizes a self-adjusting implantation process wherein the gate electrode layer is employed as mask. In such process the ion energy used must be of sufficient magnitude to prevent the ions which hit the gate electrode layer from advancing into the semiconductor material therebeneath but at the same time such ion energy must be at least sufficient to allow the ions which hit the exposed gate insulator to advance into the semiconductor zone arranged beneath the gate insulator.

The final structure of the metallizations also leaves exposed the zones between adjacent individual MOS transistors as on a single chip or the like. In the present ESFI complementary MOS circuits substantially no semiconductor material lies between adjacent individual island-like semiconductor layers, but air, or a solid insulating intermediate layer which is substantially not affected by the two implantation steps. In conventional complementary MOS circuits as those skilled in the art will appreciate in solid silicon, additional masks and therefore a plurality of process steps would, however, be required.

Figure 2:
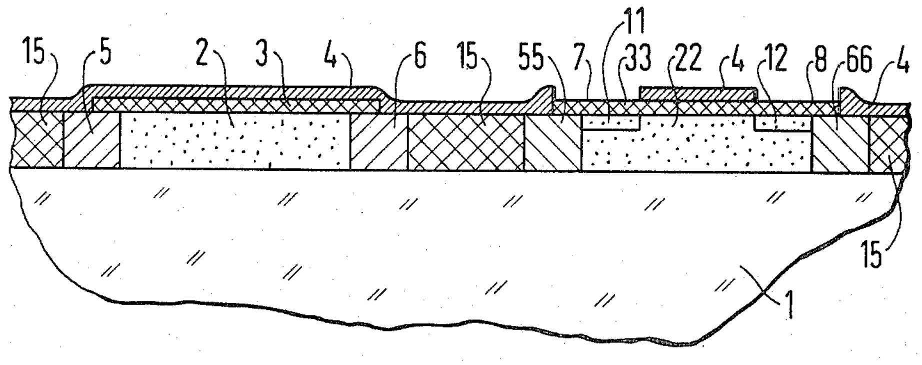
FIG. 2 is a view similar to FIG. 1, but illustrating a subsequent condition for the embodiment shown in FIG. 1 after a further processing step.

A process embodiment in accordance with the teachings of the present invention for making complementary MOS circuits will be described making reference to the FIGS. 1 to 3. In FIG. 1 is seen a complementary channel MOS structure which is covered with an aluminum layer 4 as a gate electrode layer, and which contains two different, conventional transistor types. The island-like semiconductor zones or layers 2 and 22 are arranged in known manner on an insulating substrate 1 which preferably consists of spinel or sapphire. Silicon preferably serves as semiconductor material in layers 2 and 22. The one semiconductor layer, for example, the semiconductor layer 2, contains the two diffused p-conducting regions 5 and 6 which serve as source- and drain zones, respectively. The other semiconductor, for example the semiconductor layer 22, contains the n-conducting, diffused regions 55 and 66 as source and drain zones, respectively. A gate insulator 3 and 33 respectively is arranged over layers 2 and 22 between the source and drain zones of each. $SiO_2$ is conveniently used, for example, as a material for the gate insulator 3. Between the island-like semiconductor layers 2 and 22 there preferably lies an intermediate layer 15 which comprises, for example, $SiO_2$, $Si_3N_4$, or the like. On (over) the exposed surfaces of the intermediate layers 15, gate oxide layers 3 and 33, and the island-like semiconductor layers 2 and 22, respectively, are arranged in electrode layer 4 which preferably comprises aluminum applied by vapour deposition. The thickness of this layer 4 is preferably about 1 micron. The layer 4 provides an electric contact with the diffused regions 5 and 6, and 55 and 56, respectively.

In a further embodiment of the invention, the electrode layer 4 comprises a material possessing a high melting point, for example, silicon, molybdenum, or the like.

One removes selected areas of the like 4 which lie above the areas of the semiconductor layers 2 or 22, as the case may be, into which ions are to be implanted. For example, as shown in FIG. 2, areas 7 and 8 are etched into and through the layer 4 over layer 22. Then, in this example, donors (as first ion type) are implanted through the areas 7 and 8 into the underlying regions 11 and 12 of the semiconductor layer 22. The ion implantation continues until a predetermined concentration of donors has been reached in the semiconductor layer 22 in areas 7 and 8. In regions 11 and 12 the dopant is non-diffused and the doping concentration is determined by the implanted dopant. The implantation does not affect the diffused regions 55 and 56.

Figure 3:
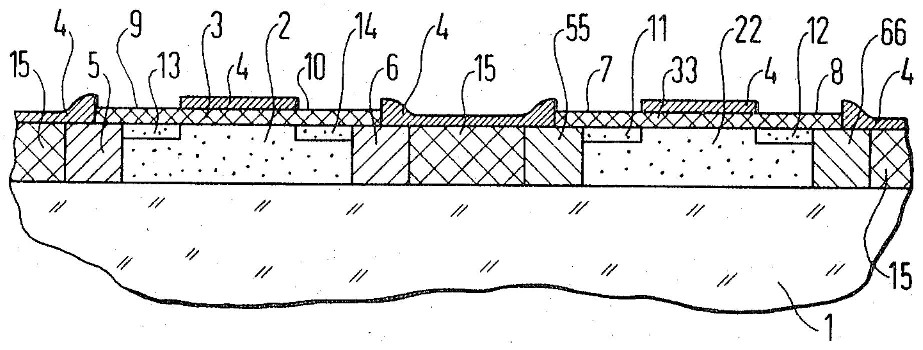
FIG. 3 is a view similar to FIG. 2, but showing a still more subsequent condition for the embodiment shown in FIG. 2 after a still further processing step.

As shown in FIG. 3, in a further processing step, areas 9 and 10 are etched into the layer 4 over layer 2 and at the same time, in the same etching step, the final metallization configuration is produced. The implantation of second ion types uniformly into the exposed areas of the entire device, not only into exposed regions 5 and 6, but also into other regions, even regions 11 and 12 is not disturbing. After this etching process to make areas 9 and 10, the conductor path arrangement thus possesses its final form.

In the next processing step, in this example, acceptors (as second ion type) are introduced uniformly into the structure by means of ion implantation. In this case the implantation continues until a predetermined dose or concentration of the acceptors has been reached in the regions 13 and 14. The dose of the acceptors which are implanted into the regions 11 and 12 is lower than the dose of the donors originally implanted into the regions 11 and 12. Since, after activation as illustratively described hereinafter, the concentration of the donors which have been implanted into the regions 11 and 12 is greater than the concentration of the acceptors which have been implanted into these regions, these regions are n-conductive, as desired.

After both implantations, the implanted regions are activated. To this end, the structure is heated preferably for a time of about 10 to 20 minutes preferably in a hydrogen atmosphere. Such a heating or tempering causes the implanted ions, which initially occupy electrically inactive interlattice positions, to transfer over to electrically active lattice positions.

Donor ions and acceptor ions may be activated in different manners as those skilled in the art will appreciate. The ratio of the number of implanted ions to the number of ions which occupy electrically active lattice positions is different after activation for donors and for acceptors, respectively. Therefore, the respective doses of acceptor ions and of donor ions are selected to be such that after the activation in the regions 11 and 12, the donor concentration is greater than the acceptor concentration.

With the aid of the process in accordance with the invention one can, as a result of a first etching process followed by a first ion implantation with p-doping produce positive source- and drain regions, and, then, after, a second etching process, followed by a second ion implantation in the complementary semiconductor zones, produce n-zones. The firstly implanted dose of doping material must in this case be greater than the secondly implanted dose.

In activation a temperature of about 500°C may be used when the gate electrode material is aluminum, while temperatures above 500°C may be employed when the gate electrode material has a high melting point, such as silicon, molybdenum or the like. Preferred semiconductor zones consist of silicon or gallium asenide, preferred substrates consist of spinel or sapphire. Activation is preferably carried out after the second activation. The first ion type may comprise donors, the second acceptors; or vice versa.

Other and further embodiments and variations of the present invention will become apparent to those skilled in the art from a reading of the present specification taken together with the drawings and no undue limitations are to be inferred or implied from the present disclosure.

What is claimed is:

1. In a process for the production of thin layer complementary channel MOS circuits in which semiconductor zones are applied in the form of islands to an electrically insulating substrate, in which these semiconductor zones are provided with regions exhibiting different doping, and in which a gate insulator layer is applied to the island-like semiconductor zones, for transistors, the improvement which comprises the steps of A. applying a gate electrode layer of electrode material over both the gate oxide layers and the exposed surfaces of the semiconductor zones,
B. first etching first selected areas of said gate electrode layer above at least one semiconductor zone of one dopable type to remove in first selected areas said electrode material therefrom,
C. first implanting by ion implantation a doping concentration of ions of a first ion type in said first so etched selected areas,
D. secondly etching second selected areas of said gate electrode layer above at least one semiconductor zone of complementary type relative to said semiconductor (zone(s) of said one dopable type to remove in said second selected areas said electrode material therefrom, and
E. secondly implanting by ion implantation ions of a seocond ion type in said second so etched selected areas without further masking of said first selected areas, said ions of said second ion type resulting in a doping which is opposite to that produced by said first ion type, said second implanting being sufficient to produce an ion concentration sufficient to dope but being in a concentration which is less than the concentration of said first ion type in said first so etched selected areas.

2. The process of claim 1, wherein firstly donors of a predetermined dose are implanted, and wherein secondly acceptors are implanted, the dose of the donors being greater than the dose of the acceptors.

3. The process of claim 1, wherein firstly acceptors of a predetermined dose are implanted and wherein secondly donors are implanted, the dose of the acceptors being greater than the dose of the donors.

4. The process of claim 1 wherein activation is carried out after the second ion implantation.

5. The process of claim 1 wherein the substrate consists of spinel.

6. The process of claim 1 wherein the substrate consists of sapphire.

7. The process of claim 1 wherein said semiconductor zones consist of silicon.

8. The process of claim 1 wherein the semiconductor zones consist of gallium arsenide.

9. The process of claim 1 wherein the gate electrode material is aluminum.

10. The process of claim 9 wherein activation of the product is carried out for about 10 to 20 minutes at about 500°C in a hydrogen atmosphere.

11. The process of claim 1 wherein the gate electrode material consists of an electrode material which possesses a high melting point.

12. The process of claim 11 wherein activation of the product is carried out at temperatures above 500°C for about 10 to 20 minutes.

13. The process as claimed in claim 11 wherein the gate electrode material consists of silicon.

14. The process of claim 11 wherein the gate electrode material consists of molybdenum.

* * * * *